(12) United States Patent
Hsu et al.

(10) Patent No.: US 10,256,801 B2
(45) Date of Patent: Apr. 9, 2019

(54) INTEGRATED CIRCUIT WITH CLOCK DETECTION AND SELECTION FUNCTION AND RELATED METHOD AND STORAGE DEVICE

(71) Applicant: M31 Technology Corporation, Hsinchu County (TW)

(72) Inventors: Chih-Cheng Hsu, New Taipei (TW); Yuan-Hsun Chang, Hsinchu County (TW); Chang-Huan Liang, Hsinchu County (TW)

(73) Assignee: M31 Technology Corporation, Hsinchu County (TW)

( * ) Notice: Subject to any disclaimer, the term of this patent is extended or adjusted under 35 U.S.C. 154(b) by 0 days.

(21) Appl. No.: 15/654,695

(22) Filed: Jul. 19, 2017

(65) Prior Publication Data

US 2018/0059159 A1    Mar. 1, 2018

Related U.S. Application Data

(60) Provisional application No. 62/382,232, filed on Aug. 31, 2016.

(51) Int. Cl.
*H03K 5/19* (2006.01)
*H03K 5/22* (2006.01)
*G01R 29/027* (2006.01)
*G06F 1/06* (2006.01)
*H03L 7/14* (2006.01)
*G06F 1/12* (2006.01)

(52) U.S. Cl.
CPC ........... *H03K 5/19* (2013.01); *G01R 29/0273* (2013.01); *G06F 1/06* (2013.01); *G06F 1/12* (2013.01); *H03K 5/22* (2013.01); *H03L 7/145* (2013.01)

(58) Field of Classification Search
CPC ........ G06F 1/06; H03L 7/145; G01R 29/0273
See application file for complete search history.

(56) References Cited

U.S. PATENT DOCUMENTS

| 7,506,810 | B2 | 3/2009 | Whaley |
| 7,711,974 | B1 | 5/2010 | You |
| 8,049,569 | B1 * | 11/2011 | Wright .................... H03L 7/104 331/161 |
| 8,996,906 | B1 * | 3/2015 | Townley .................. G06F 1/06 713/600 |
| 9,292,038 | B1 | 3/2016 | Ozalevli |

(Continued)

*Primary Examiner* — Thomas J. Hiltunen
(74) *Attorney, Agent, or Firm* — Winston Hsu

(57) ABSTRACT

An integrated circuit with clock detection and selection function for use in a storage device includes: an embedded oscillator, a detection circuit and a selection circuit. The embedded oscillator is configured to generate an embedded clock signal. The detection circuit includes a sampling and counting circuit and a clock determination circuit. The detection circuit, and is configured to detect existence of a reference clock signal provided by a host based on sampling and counting operations that are performed according to a signal on a clock signal lane and the embedded clock signal. The selection circuit is coupled to the detection circuit and the embedded oscillator, and is configured to select one of the embedded clock signal and the signal on the clock signal lane according to the existence of the reference clock signal as an output clock signal, thereby to provide the output clock signal to the storage device.

20 Claims, 7 Drawing Sheets

(56) References Cited

U.S. PATENT DOCUMENTS

| | | | |
|---|---|---|---|
| 9,367,081 B2* | 6/2016 | Herbeck | G06F 1/12 |
| 2002/0136044 A1* | 9/2002 | Werner | G11C 5/145 |
| | | | 365/45 |
| 2003/0061529 A1* | 3/2003 | Iwasa | G06F 1/08 |
| | | | 713/600 |
| 2004/0225836 A1 | 11/2004 | Lin | |
| 2006/0043202 A1* | 3/2006 | Kim | G06K 19/0723 |
| | | | 235/492 |
| 2006/0258311 A1* | 11/2006 | Pestryakov | H04B 1/005 |
| | | | 455/165.1 |
| 2008/0313487 A1 | 12/2008 | Mochizuki | |
| 2010/0127740 A1* | 5/2010 | Eto | G06F 1/3203 |
| | | | 327/151 |
| 2012/0049919 A1 | 3/2012 | Fujii | |
| 2012/0274146 A1 | 11/2012 | Laur | |
| 2014/0380083 A1 | 12/2014 | Sharifie | |
| 2016/0269034 A1* | 9/2016 | Winemiller | G06F 1/12 |
| 2017/0060171 A1* | 3/2017 | Kitagawa | G06F 1/04 |

\* cited by examiner

INTEGRATED CIRCUIT WITH CLOCK DETECTION AND SELECTION FUNCTION AND RELATED METHOD AND STORAGE DEVICE

CROSS REFERENCE TO RELATED APPLICATIONS

This application claims the benefit of U.S. Provisional Application No. 62/382,232, filed on Aug. 31, 2016. The entire contents of the related applications are incorporated herein by reference.

BACKGROUND OF THE INVENTION

1. Field of the Invention

The present invention relates to digital data communication system, and more particularly, to an integrated circuit with clock detection and selection function, a method thereof and a related storage device.

2. Description of the Prior Art

In high-speed data communication systems, a highly accurate reference clock signal is essential and necessary for synchronization between a host and a device. When the communication initializes, the host may specify one or more frequencies at which the data will be transferred as well as the device needs to operate through a negotiation process. Accordingly, the host provides a reference clock signal with the specified frequencies to the device during a communication period. In some system designs, the host may not provide the reference clock to the device. Further, in some system designs, the negotiation process relies upon extra mechanisms that are not expressly defined in the specification of the data communication standard. Hence, it is possible that the device cannot recognize the frequency of the reference clock signal or the device cannot determine its operating frequency because the extra mechanism is unavailable on the device. Such conditions may degrade the communication quality or even lead to communication failure.

SUMMARY OF THE INVENTION

It is one objective of the present invention to provide an integrated circuit with clock detection and selection function, a method thereof, and a related storage device for use in a host-device system. The integrated circuit and method of the present invention can detect the existence of the reference clock signal. This allows the device to properly and quickly switch its operating frequency and/or operating mode in response to a mode switching of the host. In addition, the integrated circuit and method can also determine the frequency of the reference clock signal automatically without any extra information from the host. As the frequency of the reference clock signal is recognized, the device can quickly achieve synchronization with the host.

According to one embodiment of the present invention, an integrated circuit with clock detection and selection function for use in a storage device is provided. The integrated circuit comprises: an embedded oscillator, a detection circuit and a selection circuit. The embedded oscillator is configured to generate an embedded clock signal. The detection circuit is coupled to the embedded oscillator, and is configured to detect existence of a reference clock signal provided by a host based on sampling and counting operations that are performed according to a signal on a clock signal lane and the embedded clock signal. The detection circuit also comprises a sampling and counting circuit and a clock determination circuit. The sampling and counting circuit is configured to perform a sample operation according to the signal on the clock signal lane and the embedded clock signal and accordingly to increment a counter value. The clock determination circuit is coupled to the sampling and counting circuit, and configured to determine the existence of the reference clock signal and a frequency of the reference clock signal according to the counter value. The selection circuit is coupled to the detection circuit and the embedded oscillator, and is configured to select one of the embedded clock signal and the signal on the clock signal lane according to the existence of the reference clock signal to provide an output clock signal to the storage device.

According to one embodiment of the present invention, a method for clock detection and selection for use in a storage device is provided. The method comprises: generating an embedded clock signal; detecting existence of a reference clock signal provided by a host based on sampling and counting operations that are performed according to a signal on a clock signal lane and the embedded clock signal; and selecting one of the embedded clock signal and the signal on the clock signal lane according to the existence of the reference clock signal to provide an output clock signal to storage device. Additionally, the step of detection the existence of the reference clock signal comprises: sampling according to the signal on the clock signal lane and the embedded clock signal and accordingly incrementing a counter value; determining the existence of the reference clock signal; and determining a frequency of the reference clock signal according to the counter value if the reference clock signal exists.

According to one embodiment of the present invention, a storage device is provided. The storage device comprises: a storage circuit for storing data; a device controller and a device PHY. The device controller is coupled to the storage circuit, and configured to control the storage circuit to store the data. The device PHY is coupled to the device controller and configured to receive the data and provide the data to the device controller. The device PHY comprises an integrated circuit coupled to the device controller. The integrated circuit comprises: an embedded oscillator, a detection circuit and a selection circuit. The embedded oscillator is configured to generate an embedded clock signal. The detection circuit is coupled to the embedded oscillator, and configured to detect existence of a reference clock signal provided by a host based on sampling and counting operations that are performed according to a signal on a clock signal lane and the embedded clock signal. The detection circuit comprises: a sampling and counting circuit configured to perform a sample operation according to the signal on the clock signal lane and the embedded clock signal and accordingly to increment a counter value; and a clock determination circuit that is coupled to the sampling and counting circuit, configured to determine the existence of the reference clock signal and a frequency of the reference clock signal according to the counter value. The selection circuit is coupled to the embedded oscillator and the detection circuit and configured to select one of the embedded clock signal and the signal on the clock signal lane according to the existence of the reference clock signal as an output signal, thereby to provide the output clock signal to the storage device.

These and other objectives of the present invention will no doubt become obvious to those of ordinary skill in the art after reading the following detailed description of the preferred embodiment that is illustrated in the various figures and drawings.

DETAILED DESCRIPTION

Reference throughout this specification to "one embodiment", or "an example" means that a particular feature, structure or characteristic described in connection with the embodiment or example is included in at least one embodiment of the present embodiments. Thus, appearances of the phrases "in one embodiment", "in an embodiment", "or "an example" in various places throughout this specification are not necessarily all referring to the same embodiment or example. Furthermore, the particular features, structures or characteristics may be combined in any suitable combinations and/or sub-combinations in one or more embodiments or examples. In addition, it is appreciated that the figures provided herewith are for explanation purposes to persons ordinarily skilled in the art and that the drawings are not necessarily drawn to scale.

Additionally, any examples or illustrations given herein are not to be regarded in any way as restrictions on, limits to, or express definitions of any term or terms with which they are utilized. Instead, these examples or illustrations are to be regarded as being described with respect to one particular embodiment and as being illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms. Language designating such non-limiting examples and illustrations includes, but is not limited to: "for example," "for instance," "e.g.," and "in one embodiment."

The flowchart and block diagrams in the flow diagrams illustrate the architecture, functionality, and operation of possible implementations of systems, methods, and computer program products according to various embodiments of the present embodiments. In this regard, each block in the flowchart or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

Figure 1:
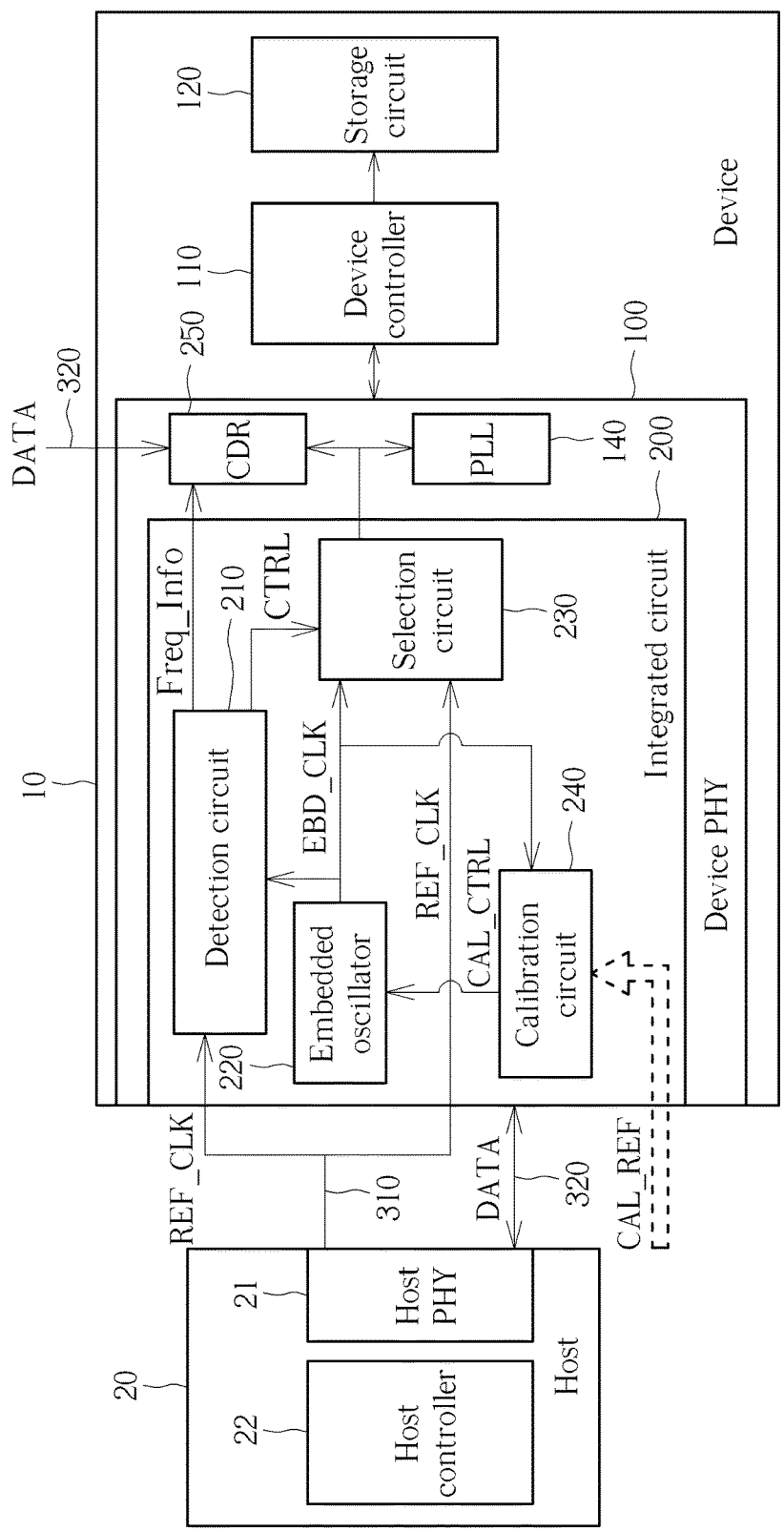
FIG. 1 illustrates a schematic diagram of an integrated circuit with clock detection and selection function according to one embodiment of the present invention.

FIG. 1 illustrates a schematic diagram of an integrated circuit with clock detection and selection function of a device and a corresponding host according to one embodiment of the present invention. As illustrated, a device 10 and a host 20 communicate with each other through a clock signal lane 310 and a data signal lane 320 that are connected between a device PHY 100 and a host PHY 21. The device 10 further comprises a device controller 110 for controlling operations of each part of the device 10, such as the device PHY 100, while the host 20 further comprises a host controller 22 for controlling operations of each part of the host 20, such as the host PHY 22.

The host 20 may communicate with the device 10 in a low-speed communication mode or in a high-speed communication mode. In the low-speed communication mode, the host 20 may not provide a reference clock signal REF_CLK, and synchronization between the host 20 and the device 10 may reply upon a clock signal that is internally generated by the device 10. In the high-speed communication mode, the host PHY 21 of the host 20 provides the reference clock signal REF_CLK to the device PHY 100 through the clock signal lane 310. In a preferred embodiment, the device 10 could be a universal flash storage (UFS) device and comprises a storage circuit 120 (preferably a flash memory), wherein the data may be written or read to/from the storage circuit 120 in response to a request sent by the host 20. In addition, the host 20 may be a UFS host, and both of the host PHY 21 and the device PHY 100 may be compliant with UFS standard.

The reference clock signal REF_CLK provided by the host 20 is mainly used by the device PHY 100 when the device PHY 100 extracts information carried by serial data signal DATA on the data lane 320 in the high-speed communication mode. The device PHY 100 may demodulate and decode the received data signal DATA according to the reference clock signal REF_CLK. In addition, the device controller 110 may be also operated based on the reference clock signal REF_CLK.

The device PHY 100 includes an integrated circuit with clock detection and selection function 200. The integrated circuit 200 is able to detect whether the host PHY 21 provides the reference clock signal REF_CLK, and determines a frequency of the reference clock signal REF_CLK. This facilitates recognizing what communication mode the host 20 is operated in and accordingly allows the device 10 to switch to a same communication mode.

The integrated circuit 200 comprises a detection circuit 210, an embedded oscillator 220 and a selection circuit 230. The embedded oscillator 220 is configured to generate an embedded clock signal EBD_CLK, having the frequency that is substantially identical to the frequency required by synchronizing with the host 20 in the low-speed communication mode. Since the signal on the clock signal lane 310 may be the reference clock signal REF_CLK or not, the detection circuit 210 is configured to detect existence of the reference clock signal REF_CLK. If the detection circuit 210 determines the signal on the clock signal line 310 is the reference clock signal REF_CLK, this means the host 20 has switched to the high-speed communication mode and the device 20 also needs to switch to the high-speed communication mode. In response to this, the detection circuit 210 asserts the control signal CTRL, so as to control the selection circuit 230 to select the signal on the clock signal line 310 as an output clock signal and provide it to a PLL 140 of the device PHY 100. The detection circuit 210 calculates the frequency of the reference clock signal REF_CLK on the clock signal lane 310. According to the reference clock signal REF_CLK and the calculated frequency information, the device 10 is able to synchronize with the frequency of the high-speed communication mode quickly.

On the other hand, if the detection circuit 220 determines that the signal on the clock signal line 310 is not the reference clock signal REF_CLK (e.g. noise) or the reference clock signal REF_CLK on the clock signal line 310 is less stable, this means the host 20 is not in or not ready to enter the high-speed communication mode. Accordingly, the detection circuit 210 de-asserts the control signal CTRL, so as to control the selection circuit 230 to select the embedded clock signal EBD_CLK as the output clock signal and provide it to the PLL 140. The PLL 140 accordingly synchronizes with the host 20 according to the embedded clock signal EBD_CLK. In view of this, no matter whether the host 20 provides the reference clock signal REF_CLK or not, the integrated circuit 200 is able to facilitate and achieve the synchronization between the device 10 and the host 20.

In a preferred embodiment, the integrated circuit 200 may further comprise a calibration circuit 240. The calibration circuit 240 is configured to calibrate the embedded oscillator 220 with a highly accurate reference clock signal CAL_REF provided by an external clock generator. The calibration circuit 240 compares the frequency of the embedded clock signal EBD_CLK with the frequency of the reference clock signal CAL_REF. Accordingly, the calibration circuit 240 sends a control signal CAL CTRL to adjust the frequency of the embedded oscillator 220 based on a comparison result, such that the accuracy of the frequency of the embedded clock signal EBD_CLK can be guaranteed. The calibration circuit 240 may calibrate the embedded oscillator 220 in factory test. Alternatively, the calibration circuit 240 may calibrate the embedded oscillator 220 each time the embedded oscillator 220 starts to operate to provide the embedded clock signal EBD_CLK.

Figure 2:
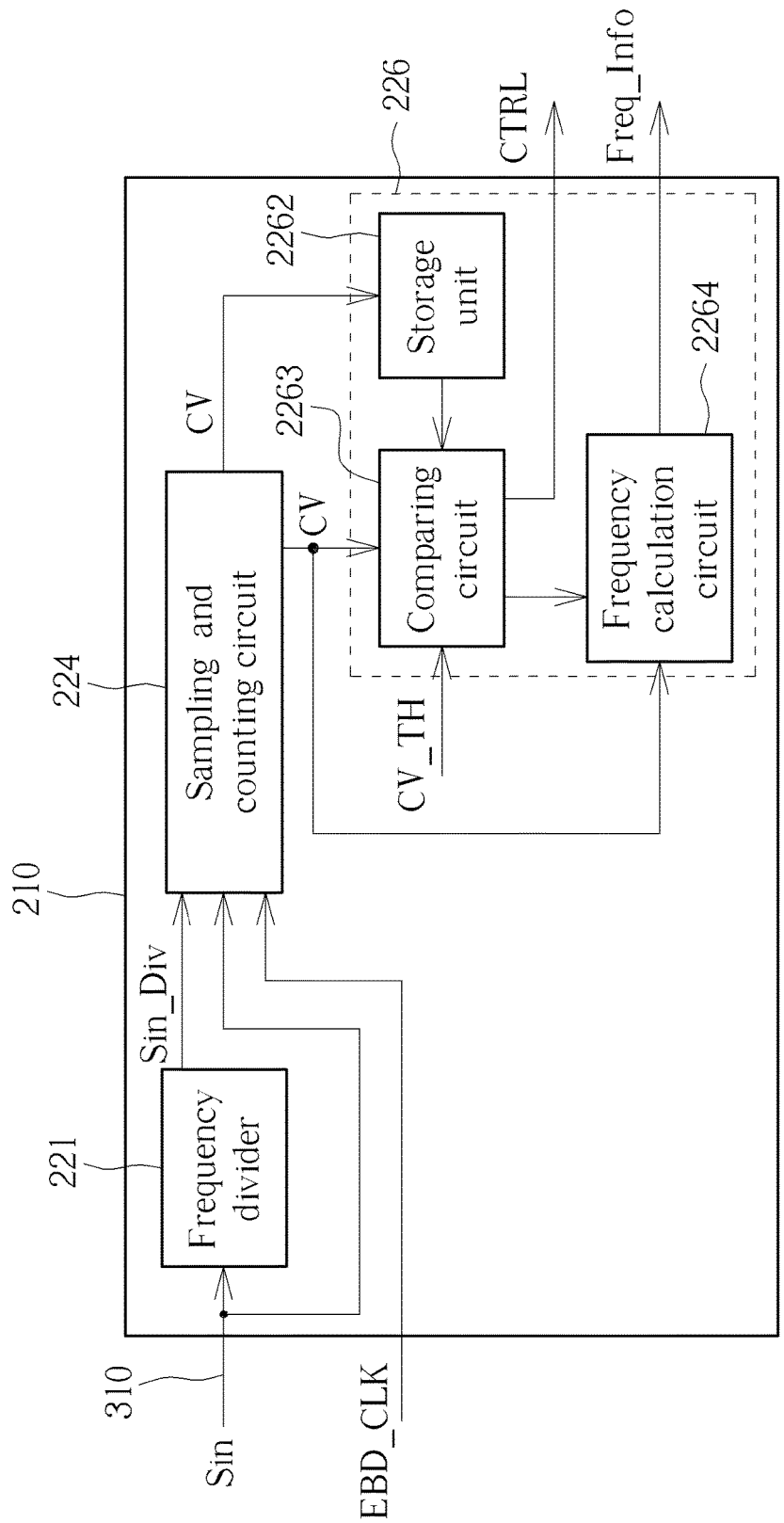
FIG. 2 illustrates a block diagram of a detection circuit according to one embodiment of the present invention.

FIG. 2 illustrates a block diagram of the detection circuit 210 according to one embodiment of the present invention. The auto-detection circuit 210 comprises a sampling and counting circuit 224 and a clock determination circuit 226. The sampling and counting circuit 224 samples a frequency-divided signal Sin_Div generated by a frequency divider 221 or the signal Sin on the clock signal line 310 with reference to the embedded clock signal EBD_CLK and accordingly generates a counter value CV. The clock determination circuit 226 determines whether the reference clock signal REF_CLK exists, and calculates the frequency of the reference clock signal REF_CLK according to the counter value CV.

In the following, the sampling and counting circuit 224 is described as sampling the frequency-divided signal Sin_Div rather than the signal Sin on the clock signal lane 310, to generate the counter value CV. However, this is just a preferred embodiment of the present invention. As will be illustrated later, it is also available that the sampling and counting circuit 224 samples the signal Sin on the clock signal lane 310 to generate the counter value CV.

Figure 3:
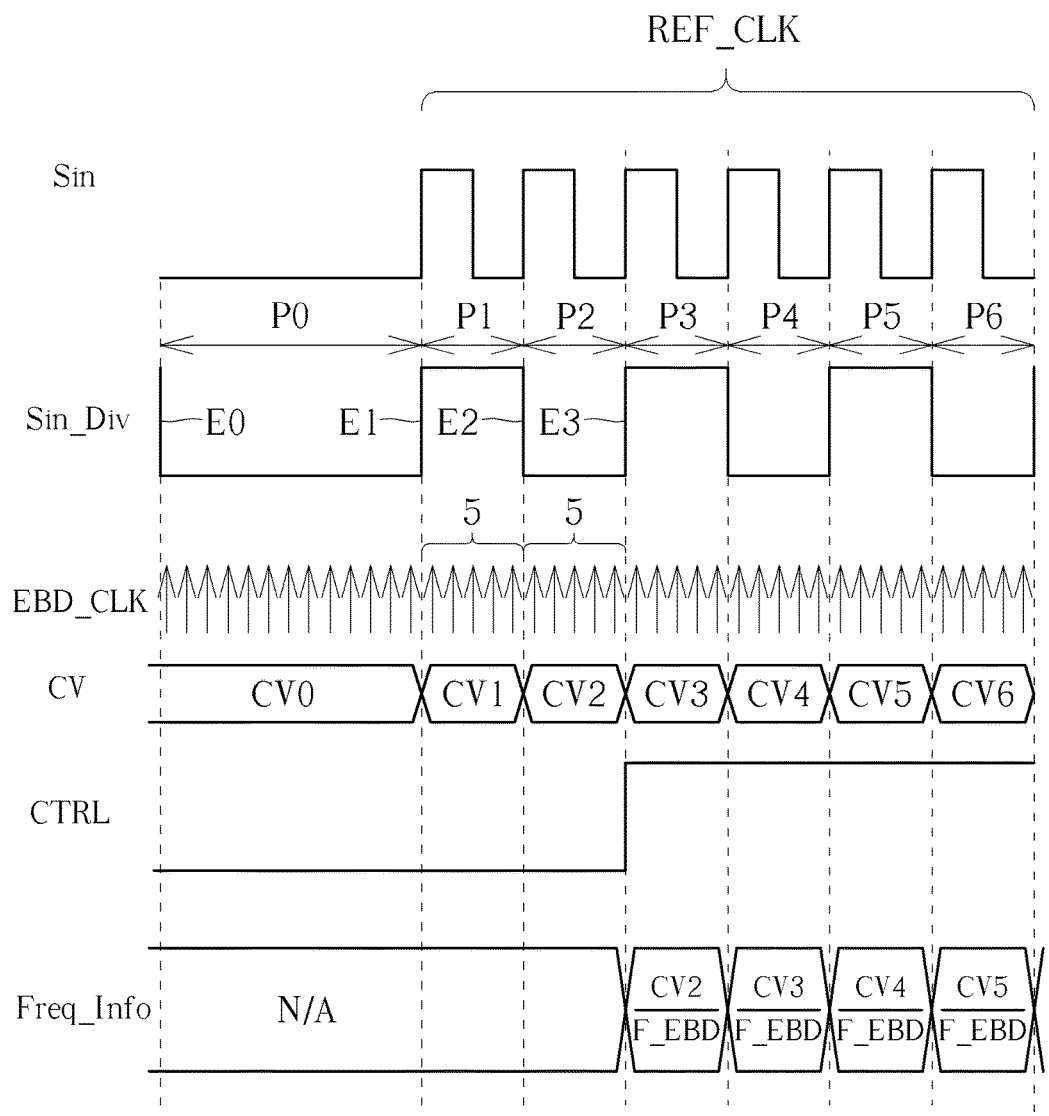
FIG. 3 illustrates a timing diagram regarding signals in the detection circuit according to one embodiment of the present invention.

Regarding the sampling and counting circuit 224, please refer to FIG. 3 for better understandings. Rising edges and falling edges of the frequency-divided signal Sin_Div determines a sample and count period. During the sample and count period, the number of the clock pulses of embedded clock signal EBD_CLK is counted by the sampling and counting circuit 224. For example, during the sample and count period P1, once the sampling and counting circuit 224 detects the rising edge E1 of the frequency-divided signal Sin_Div, the sampling and counting circuit 224 starts to increment the counter value CV from zero. When the sampling and counting circuit 224 detects the falling edge E2 of the frequency-divided signal Sin_Div, the sampling and counting circuit 224 outputs a counter value CV1 accumulated during the sample and count period P1 to a storage unit 2262 of the clock determination circuit 226. After the storage unit 2262 stores the counter value CV1, the sampling and counting circuit 224 is reset.

Also, upon detecting the falling edge E2 of the frequency-divided signal Sin_Div, the sampling and counting circuit 224 again starts to increment the counter value from zero and a new sample and count period P2 begins. When the sampling and counting circuit 224 detects the rising edge E3 of the frequency-divided signal Sin_Div, the sampling and counting circuit 224 stops incrementing the counter value CV. At this time, a counter value CV2 accumulated during the sample and count period P2 and the counter value CV1 accumulated during the sample and count period P1 (that is currently stored in the storage unit 2242) will be provided to a comparing circuit 2263 of the clock determination circuit 226. As mentioned above, the rising edges and falling edges of the frequency-divided signal Sin_Div are used to determine a start point and an end point of the sample and count period, triggering the sampling and counting circuit 224 to start/stop counting or reset.

The comparing circuit 2263 compares the "previous" counter value CV1 accumulated in the sample and count period P1 with the "current" counter value CV2 accumulated in the sample and count period P2 to determine the existence of the reference clock REF_CLK. Specifically, if a difference between the previous counter value CV1 and the "current" counter value CV2 is not higher than a counting threshold CV_TH, the comparing circuit 2263 determines the signal Sin on the clock signal lane 310 is the reference clock signal REF_CLK. After the comparing circuit 2263 finishes comparing, the previous counter value CV1 stored in the storage unit 2262 will be updated with the current counter value CV2.

Please refer to FIG. 3 again and focus on the sample and count period P0 as well as the sample and count period P1 for understanding why the difference between the counter values is able to determine the existence of the reference clock signal REF_CLK. As illustrated, the falling edge E0 of the frequency-divided signal Sin_Div (which may be caused by noises on the clock signal line 310 or an unstable state of the reference clock signal REF_CLK) triggers the sampling and counting circuit 224 starts to count up. As the falling edge E0 of the frequency-divided signal Sin_Div is not caused by a real or stable reference clock signal REF_CLK, the sample and count period P0 will be much different from the sample and count periods P1 and P2 in length. In the case, the counter value CV0 accumulated during the sample and count period P0 is significantly larger than the counter values CV1 accumulated during the sample and count period P1. Hence, if the difference between the previous counter value and the current counter value is too large, it can be determined that the signal Sin on the clock signal lane 310 is not the real reference clock signal REF_CLK or the unstable reference clock signal REF_CLK. On the other hand, as the frequency-divided signal Sin_Div during the sample and count periods P1-P6 are derived from the real reference clock signal REF_CLK, the counter values CV1-CV6 of the sample and count periods P1-P6 are very close. Therefore, if the difference between the previous counter value and the current counter value is small enough, it can be determined that the signal Sin on the clock signal lane 310 is the real reference clock signal REF_CLK.

After confirming the signal Sin on the clock signal lane 310 is the reference clock signal REF_CLK, the comparing circuit 2263 asserts the control signal CTRL for controlling the clock selection circuit 230 and enables a frequency calculation circuit 2264 to calculate the frequency of the reference clock signal REF_CLK according to the current counter value. For example, after the sample and count period P2, the comparing circuit 2263 confirms the signal Sin on the clock signal lane 310 is the reference clock signal REF_CLK, the frequency calculation circuit 2264 is enabled to calculate the frequency by dividing the counter value CV2 (i.e., 5) by the frequency of the sampling rate (i.e., the frequency F_EBD of the embedded clock signal EBD_CLK). The result of calculation Freq_Info may be sent to other circuits in the device PHY 100 for further purposes. For example, the device PHY 100 may further comprise a clock and data recovery (CDR) circuit 250 for data to clock phase alignment. During the CDR process, the CDR circuit may rely on the result of calculation Freq_Info to configure hardware elements in the CDR circuit, thereby to achieve better and more precise CDR results. Please note that the frequency calculation depends upon the divisor of the frequency division. When the reference clock signal REF_CLK on the clock signal lane 310 is divided by 2 in frequency, the frequency thereof can be calculated as mentioned above. However, if the reference clock signal REF_CLK on the clock signal lane 310 is not divided by 2, such as, 4, the frequency calculated in the above-mentioned manner needs to be multiplied by 2 to derive the correct frequency.

In above embodiments, the clock determination circuit 226 basically determines the existence of the reference clock REF_CLK and the frequency thereof according to the frequency-divided signal Sin_Div obtained from the frequency divider 221. However, according to various embodiments of the present invention, it is possible to bypass the frequency divider 221 and determine the existence of the reference clock REF_CLK and the frequency directly according to the signal Sin on the clock signal lane 310. Please refer to FIG. 3 and FIG. 4 for better understandings on the difference between with and without frequency divider 221. In the embodiment of FIG. 3, when the frequency-divided signal Sin_Div is obtained from the real reference clock signal REF_CLK, the sample and count periods (e.g. the sample and count periods P1 and P2) are basically identical in length. When the sample and count periods are identical in length, the counter values accumulated in different sample and count periods must be very close. Hence, it is easy to decide the counting threshold CV_TH under such condition because it only needs to takes a small margin of error into consideration.

Figure 4:
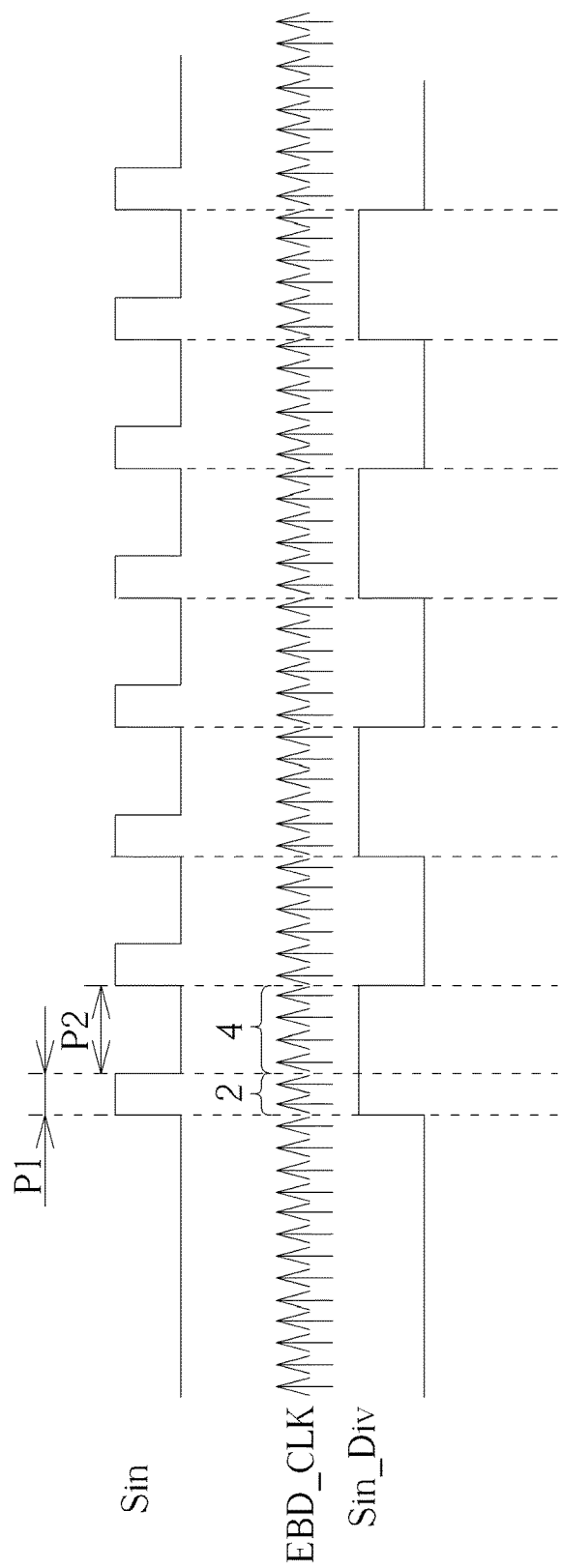
FIG. 4 illustrates a timing diagram explaining how a frequency divider in the detection circuit affects the counter values.

However, if the frequency divider 221 is bypassed and the duty cycle of the reference clock signal REF_CLK is not around 50%, the sample and count periods will not be uniform anymore and there will be inherent difference between the counter values accumulated in different sample and count periods having different lengths. For example, as illustrated by FIG. 4, the counter value accumulated in the sample and count period P1 is 2, while the counter value accumulated in the sample and count period P2 is 4. From such example, it can be understood that the difference may vary with the duty cycle and sometimes be significant. Therefore, it is very difficult to decide a proper counting threshold CV_TH suitable for all the possible duty cycles without the frequency divider 221.

Figure 5:
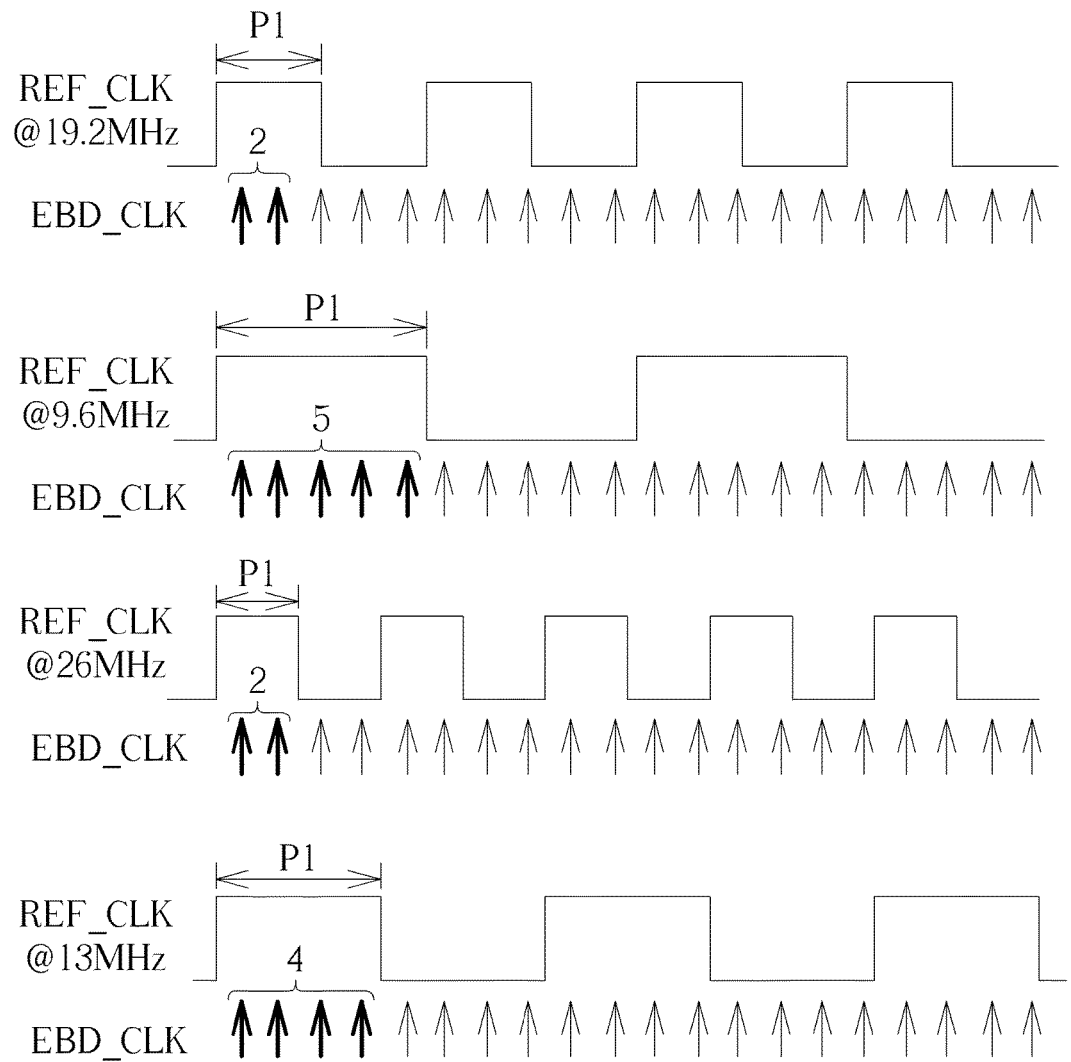
FIG. 5 illustrates a timing diagram explaining how a frequency divider in the detection circuit improves the resolution of the frequency calculation.

Another advantage of the frequency divider 221 is to improve the resolution of the frequency calculation. Please refer to FIG. 5 for better understandings. As illustrated by FIG. 5, the reference clock signal REF_CLK can be at close frequencies, 19.2 MHz and 26 MHz. If the frequency divider 221 is bypassed, the counter values in the sample and count period P1 regarding the reference clock signal REF_CLK at the frequencies 19.2 MHz and 26 MHz are both "2". In view of this, the frequency calculation circuit 2264 cannot recognize the difference between frequencies and fails to precisely calculate the frequency of reference clock signal REF_CLK. However, if the frequency of the reference clock signal REF_CLK is divided by 2, the counter values in the sample and count period P1 regarding the reference clock signal REF_CLK at the frequencies 9.2 MHz and 13 MHz will be "4" and "5", respectively. Hence, by dividing the reference clock signal REF_CLK in frequency in advance, the frequency calculation circuit 2264 can recognize the small difference between frequencies and precisely calculate the frequency of reference clock signal REF_CLK.

Figure 6:
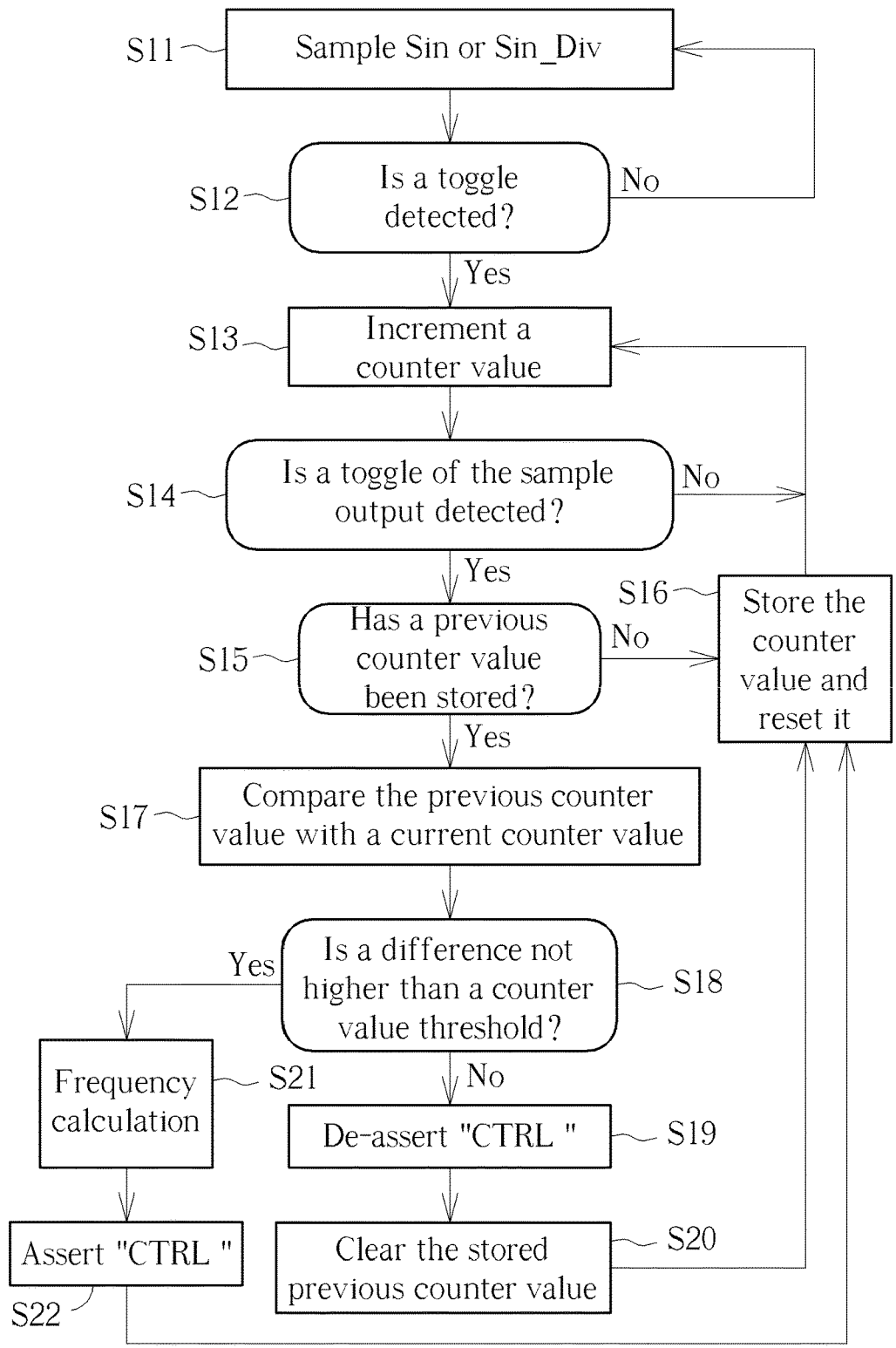
FIG. 6 illustrates a flow chart of the auto-negotiation process according to one embodiment of the present invention.

FIG. 6 illustrates a flow chart of the detection process performed by the detection circuit 210 according to one embodiment of the present invention. At step S11, the signal Sin on the signal lane 310 or the frequency-divided signal Sin_Div is sampled by the sampling and counting circuit 224 with reference to the embedded clock EBD_CLK. At step S12, the sampling and counting circuit 224 detect whether there is a toggle of the signal Sin on the signal lane 310 or there is a toggle of the frequency-divided signal Sin_Div. If yes, the flow goes to the step S13; otherwise, the flow goes back to step S11. At step S13, the sampling and counting circuit 224 increments the counter value. At the step 14, the sampling and counting circuit 224 again detects whether there is a toggle of the signal Sin on the signal lane 310 or there is a toggle of the frequency-divided signal Sin_Div. If yes, the flow goes to step S15; otherwise, the flow goes back to the step S13. At the step S15, the sampling and counting circuit 224 stops incrementing the counter value and it is checked whether the previous counter value accumulated in the previous sample and count period has stored in the storage unit 2262. If yes, the flow goes to step S17; otherwise, the flow goes to the step S16. At step S16, the current counter value accumulated in the current sample and count period is stored to the storage unit 2262 and the sampling and counting circuit 224 is reset. After step S16, the flow goes back to the step S13. At step S17, the comparing circuit 2263 compares the previous counter value with the current counter value and the flow proceeds to step S18. At step 18, it is determined whether the difference between the previous counter value and the current counter value is not higher than the counter value threshold CV_TH. If yes, the flow goes to step S21; otherwise, the flow goes to S19. At step 19, the comparing circuit 2263 de-asserts the control signal CTRL, and the flow proceeds to step S20, which clear the previous counter value stored in the storage unit 2262. Then, the flow goes back to step S16. On the other hand, if the flow goes to step S21, the frequency calculation circuit 2264 calculates the frequency of the reference clock signal REF_CLK according to the current counter value and the frequency of the embedded clock signal EBD_CLK. After step S21, the flow goes to step S22, where the comparing circuit 2263 asserts the control signal CTRL. Then, the flow goes to step S16.

Figure 7:
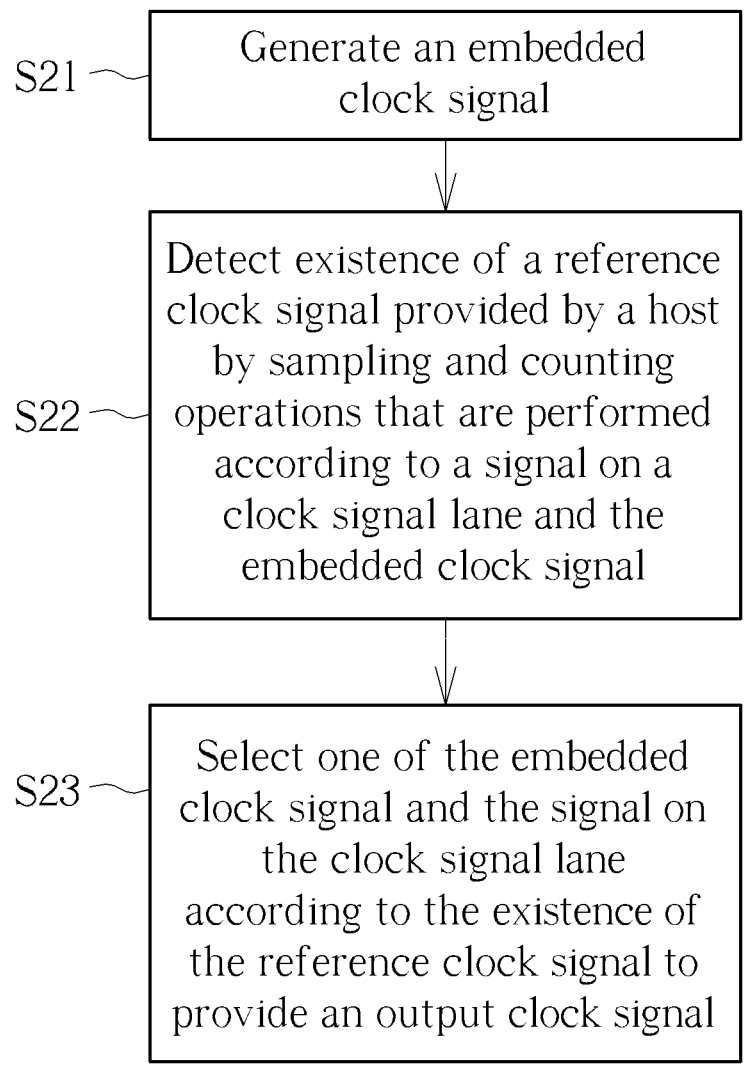
FIG. 7 illustrates a flow chart of the detection process according to one embodiment of the present invention.

FIG. 7 illustrates a flow chart of a clock detection and selection process performed by the integrated circuit 200 according to one embodiment of the present invention. At step S31, the embedded clock signal EBD_CLK is generated by the embedded oscillator 220. At step S32, the detection circuit 210 detects existence of the reference clock signal REF_CLK provided by the host 20 by sampling and counting operations that are performed according to the signal on the clock signal lane 310 and the embedded clock signal EBD_CLK. At step S33, the selection circuit 230 selects one of the embedded clock signal EBD_CLK and the signal on the clock signal lane 310 according to the existence of the reference clock signal REF_CLK to provide the output clock signal to the device PHY 100.

In conclusion, the detection of the existence of the reference clock signal REF_CLK achievable by the integrated circuit with clock detection and selection function and method of the present invention facilitates synchronizing the communication mode of the device 10 with the host 20. Once the reference clock signal exists, the device 10 switches to/stays in the high-speed communication mode. Additionally, the frequency calculation of the reference clock signal REF_CLK achievable by the integrated circuit with clock detection and selection function and method of the present invention facilitates synchronization the frequency of the device 10 with the host 20. Via frequency calculation, the device 10 can operate at a proper frequency even if lacking the frequency information provided by the host 20.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit with clock detection and selection function for use in a storage device, comprising:
   an embedded oscillator, configured to generate an embedded clock signal;
   a detection circuit, coupled to the embedded oscillator, configured to detect existence of a reference clock signal provided by a host based on sampling and counting operations that are performed according to a signal on a clock signal lane and the embedded clock signal, wherein the detection circuit is capable of detecting existence and/or stability of the reference clock signal before the reference clock signal exists and/or becomes stable, and a frequency of the embedded clock signal is not lower than that of the reference clock signal, comprising:
      a sampling and counting circuit, configured to perform a sample operation according to the signal on the clock signal lane and the embedded clock signal and accordingly to increment a counter value; and
      a clock determination circuit, coupled to the sampling and counting circuit, configured to determine the existence of the reference clock signal and a frequency of the reference clock signal according to the counter value; and
   a selection circuit, coupled to the embedded oscillator and the detection circuit, configured to select one of the embedded clock signal and the signal on the clock signal lane according to the existence of the reference clock signal as an output signal, thereby to provide the output clock signal to the storage device.

2. The integrated circuit of claim 1, wherein the detection circuit further comprises:
   a frequency divider, coupled to the sampling and counting circuit and the clock signal lane, configured to divide a frequency of the signal on the clock signal lane to output a frequency-divided signal, wherein the sampling and counting circuit is configured to sample the frequency-divided signal with reference to the embedded clock signal.

3. The integrated circuit of claim 1, wherein the sampling and counting circuit starts to increment the counter value at a start point of a sample and count period and stops incrementing the counter value at an end point of the sample and count period, wherein the start point and the end point of the sample and count period is determined according to signal toggle on the clock signal lane.

4. The integrated circuit of claim 3, wherein the clock determination circuit comprises:
   a comparing circuit, coupled to the sampling and counting circuit, configured to compare a current counter value accumulated in a current sample and count period with a previous counter value accumulated in a previous sample and count period, wherein the comparing circuit determines the reference clock signal exists if a difference between the current counter value and the previous counter value is not higher than a counter value threshold; and
   a storing unit, coupled to the comparing circuit and the sampling and counting circuit, configured to store the previous counter value and update the previous counter value with the current counter value after the comparing circuit finishes comparing.

5. The integrated circuit of claim 4, wherein the clock determination circuit further comprises:
   a frequency calculation circuit, coupled to the sampling and counting circuit and the comparing circuit, configured to calculate the frequency of the reference clock signal by dividing the current counter value by a frequency of the embedded clock signal when the reference clock signal exists.

6. The integrated circuit of claim 5, wherein information regarding the frequency of the reference clock signal which is calculated by the frequency calculation circuit is provided to a clock and data recovery (CDR) circuit for configuring the CDR circuit.

7. The integrated circuit of claim 1, further comprising:
   a calibration circuit, coupled to the embedded oscillator, configured to calibrate the embedded oscillator according to the embedded clock signal and a calibration reference clock signal that is provided by an external clock generator;
   wherein the storage device is compliant with universal flash storage (UFS) standard.

8. A method for clock detection and selection for use in a storage device, comprising:
   generating an embedded clock signal;
   detecting existence of a reference clock signal provided by a host based on sampling and counting operations that are performed according to a signal on a clock signal lane and the embedded clock signal, comprising detecting existence and/or stability of the reference clock signal before the reference clock signal exists and/or becomes stable, wherein a frequency of the embedded clock signal is not lower than that of the reference clock signal, comprising:
sampling according to the signal on the clock signal lane and the embedded clock signal and accordingly incrementing a counter value;
determining the existence of the reference clock signal; and
determining a frequency of the reference clock signal according to the counter value if the reference clock signal exists;
selecting one of the embedded clock signal and the signal on the clock signal lane according to the existence of the reference clock signal as an output clock signal; and
providing the output clock signal to the storage device.

9. The method of claim 8, further comprising:
dividing a frequency of the signal on the clock signal lane to output a frequency-divided signal; and the step of sampling according to the signal on the clock signal lane and the embedded clock signal comprises:
sampling the frequency-divided signal with reference to the embedded clock signal.

10. The method of claim 8, wherein the step of incrementing the counter value comprises:
determining a start point and an end point of a sample and count period according to signal toggle on the clock signal lane; and
starting to increment the counter value at the start point of the sample and count period and stopping incrementing the counter value at the end point of the sample and count period.

11. The method of claim 10, wherein the step of determining the existence of the reference clock signal comprising:
comparing a current counter value accumulated in a current sample and count period with a previous counter value accumulated in a previous sample and count period;
determining the reference clock signal exists if a difference between the current counter value and the previous counter value is not higher than a counter value threshold; and
storing the previous counter value and updating the previous counter value with the current counter value after finishing comparing.

12. The method of claim 11, wherein step of determining the frequency of the reference clock:
calculating the frequency of the reference clock signal by dividing the current counter value by a frequency of the embedded clock signal.

13. The method of claim 8, further comprising:
calibrating the embedded clock signal according to a calibration reference clock signal that is provided by an external clock generator;
wherein the storage device is compliant with universal flash storage (UFS) standard.

14. A storage device, comprising:
a storage circuit, for storing data;
a device controller, coupled to the storage circuit, for controlling the storage circuit to store the data; and
a device PHY, coupled to the device controller, for receiving the data and provide the data to the device controller, comprising:
an integrated circuit, coupled to the device controller, comprising:
an embedded oscillator, configured to generate an embedded clock signal;
a detection circuit, coupled to the embedded oscillator, configured to detect existence of a reference clock signal provided by a host based on sampling and counting operations that are performed according to a signal on a clock signal lane and the embedded clock signal, wherein the detection circuit is capable of detecting existence and/or stability of the reference clock signal before the reference clock signal exists and/or becomes stable, and a frequency of the embedded clock signal is not lower than that of the reference clock signal, comprising:
a sampling and counting circuit, configured to perform a sample operation according to the signal on the clock signal lane and the embedded clock signal and accordingly to increment a counter value; and
a clock determination circuit, coupled to the sampling and counting circuit, configured to determine the existence of the reference clock signal and a frequency of the reference clock signal according to the counter value; and
a selection circuit, coupled to the embedded oscillator and the detection circuit, configured to select one of the embedded clock signal and the signal on the clock signal lane according to the existence of the reference clock signal as an output signal, thereby to provide the output clock signal to the storage device.

15. The storage device of claim 14, wherein the detection circuit further comprises:
a frequency divider, coupled to the sampling and counting circuit and the clock signal lane, configured to divide a frequency of the signal on the clock signal lane to output a frequency-divided signal, wherein the sampling and counting circuit is configured to sample the frequency-divided signal with reference to the embedded clock signal.

16. The storage device of claim 14, wherein the sampling and counting circuit starts to increment the counter value at a start point of a sample and count period and stops incrementing the counter value at an end point of the sample and count period, wherein the start point and the end point of the sample and count period is determined according to signal toggle on the clock signal lane.

17. The storage device of claim 16, wherein the clock determination circuit comprises:
a comparing circuit, coupled to the sampling and counting circuit, configured to compare a current counter value accumulated in a current sample and count period with a previous counter value accumulated in a previous sample and count period, wherein the comparing circuit determines the reference clock signal exists if a difference between the current counter value and the previous counter value is not higher than a counter value threshold; and
a storing unit, coupled to the comparing circuit and the sampling and counting circuit, configured to store the previous counter value and update the previous counter value with the current counter value after the comparing circuit finishes comparing.

18. The storage device of claim 17, wherein the clock determination circuit further comprises:
a frequency calculation circuit, coupled to the sampling and counting circuit and the comparing circuit, configured to calculate the frequency of the reference clock signal by dividing the current counter value by a frequency of the embedded clock signal when the reference clock signal exists.

19. The storage device of claim 18, wherein information regarding the frequency of the reference clock signal which is calculated by the frequency calculation circuit is provided to a clock and data recovery (CDR) circuit for configuring the CDR circuit, wherein the CDR circuit is included in the device PHY.

20. The storage device of claim 14, further comprising:
a calibration circuit, coupled to the embedded oscillator, configured to calibrate the embedded oscillator according to the embedded clock signal and a calibration reference clock signal that is provided by an external clock generator;
wherein the storage device is compliant with universal flash storage (UFS) standard.

* * * * *